(12) United States Patent
Yoneda (10) Patent No.: US 8,531,000 B2
(45) Date of Patent: Sep. 10, 2013

(54) SOI WAFER, METHOD FOR PRODUCING SAME, AND METHOD FOR MANUFACTURING SEMICONDUCTOR DEVICE

(75) Inventor: Kenji Yoneda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/214,007

(22) Filed: Aug. 19, 2011

(65) Prior Publication Data

US 2011/0298083 A1 Dec. 8, 2011

Related U.S. Application Data

(63) Continuation of application No. PCT/JP2010/001089, filed on Feb. 19, 2010.

(30) Foreign Application Priority Data

Apr. 22, 2009 (JP) ................... 2009-104063

(51) Int. Cl.
*H01L 29/00* (2006.01)
*H01L 27/01* (2006.01)
*H01L 27/12* (2006.01)
*H01L 31/0392* (2006.01)

(52) U.S. Cl.
USPC ........... 257/506; 257/505; 257/507; 257/347; 257/352

(58) Field of Classification Search
USPC .............. 257/506, 57, 59, 72, 347, 350, 351, 257/353, 349, 352, 505, 507
See application file for complete search history.

(56) References Cited

U.S. PATENT DOCUMENTS

| | | | | |
|---|---|---|---|---|
| 5,063,113 A | * | 11/1991 | Wada | 428/446 |
| 6,057,036 A | * | 5/2000 | Okonogi | 428/426 |
| 2008/0254595 A1 | | 10/2008 | Kawai et al. | |
| 2009/0280620 A1 | * | 11/2009 | Yoshida et al. | 438/458 |
| 2009/0321883 A1 | * | 12/2009 | Kurita | 257/617 |
| 2010/0264510 A1 | * | 10/2010 | Ohtsuki et al. | 257/506 |

FOREIGN PATENT DOCUMENTS

| | | |
|---|---|---|
| JP | 02-037771 | 2/1990 |
| JP | 08-293589 | 11/1996 |
| JP | 09-293845 | 11/1997 |
| JP | 2002-134722 | 5/2002 |
| JP | 2002-208596 | 7/2002 |
| JP | 2006-032561 | 2/2006 |
| JP | 2006-134925 | 5/2006 |
| JP | 2007-095951 | 4/2007 |
| JP | 2007-318102 | 12/2007 |
| JP | 2008-263087 | 10/2008 |
| JP | 2009-016431 | 1/2009 |
| JP | 2009-124116 | 6/2009 |
| JP | 2009-218381 | 9/2009 |

* cited by examiner

*Primary Examiner* — Chuong A. Luu
(74) *Attorney, Agent, or Firm* — McDermott Will & Emery LLP (57) ABSTRACT

An SOI wafer including: a supporting substrate 1; a BOX layer 2 provided above the supporting substrate 1, the BOX layer 2 being formed by a thermal oxidization; a gettering layer 3 provided immediately on the BOX layer 2 and mainly composed of a silicon which contains one or more of oxygen, carbon and nitrogen and contains at least oxygen; and an S layer 4 in which semiconductor devices are to be formed, the S layer 4 being mainly composed of a monocrystalline silicon.

11 Claims, 8 Drawing Sheets

SOI WAFER, METHOD FOR PRODUCING SAME, AND METHOD FOR MANUFACTURING SEMICONDUCTOR DEVICE

This is a continuation of International Application PCT/JP2010/001089, with an international filing date of Feb. 19, 2010.

TECHNICAL FIELD

The present invention relates to a structure of a SOI (Silicon-On-Insulator) wafer, a manufacturing method of the SOI wafer, and a manufacturing method of a semiconductor apparatus using the SOI wafer.

BACKGROUND ART

In recent years, as semiconductor integrated circuit apparatuses have become highly integrated, highly functional and highly speedy, the devices have been miniaturized more and more. Along with this, not only the horizontal miniaturization as seen in the miniaturization of the gate length of transistors, but the vertical miniaturization as seen in the realization of a very thin gate insulation layer has progressed as well. On the other hand, since such a miniaturization of devices increases the electrostatic capacitance (parasitic capacitance) between wires, and between a silicon substrate and wires, it causes a problem that reduction in power consumption of devices or speed-up of devices cannot be achieved effectively.

Although an insulating layer with a low electric permittivity is under development for the purpose of reducing the parasitic capacitance between wires, what is attracting attention recently as effective means for achieving the purpose is an SOI (Silicon-On-Insulator) wafer which is formed by forming an oxide layer (insulation layer) called BOX (Buried OXide) on a surface of a silicon wafer as a supporting substrate, and forming, on the BOX, a relatively thin, monocrystalline silicon layer. In recent years, an application of the SOI wafer to a three-dimensional integrated circuit is under study, as can be seen in an SOI wafer in which semiconductor devices have been further stacked for higher integration.

CITATION LIST

Patent Literature

[Patent Literature 1] Japanese Patent Application Publication No. H8-293589
[Patent Literature 2] Japanese Patent Application Publication No. H9-293845

SUMMARY OF INVENTION

Technical Problem

During a manufacture of a semiconductor device using such an SOI wafer, if metal impurities (mainly transition metals, such as Fe, Cu, Ni, and Cr, heavy metals, and noble metals) are present in a monocrystalline silicon layer (S layer) or a silicon oxide layer, they may induce a crystal defect or cause a junction leakage in the PN-junction, or an insulation breakdown in the oxide layer, which may seriously damage the electric property or reliability of the semiconductor device. In particular, in image devices, the presence of the metal impurities causes electric charges to occur, which leads to a white spot defect.

In view of this, a method called "gettering" is used to make the metal impurities harmless.

Gettering methods for use in a typical silicon wafer include: (a) a method in which an oxygen precipitation or crystal defect is used to form a crystal deformation in a deep region (several tens μm deep from the surface) where no device in the wafer is formed so that the crystal deformation can capture metal atoms; (b) a method of forming a layer on a back surface of the silicon wafer, the layer including a crystal grain boundary of a polycrystalline silicon or the like, in order for the crystal grain boundary to capture metal atoms; and (c) a method of forming a layer containing a high concentration of boron in a region deep from the surface, in order for the boron to capture metal atoms (Cu, Fe) by making pairs with the metal atoms (Cu—B, Fe—B).

On the other hand, there are known technologies of the SOI wafer where basically, the gettering ability is given to a supporting substrate in which no device is formed, not given to the S layer in which semiconductor devices are mainly formed.

Figure 8:
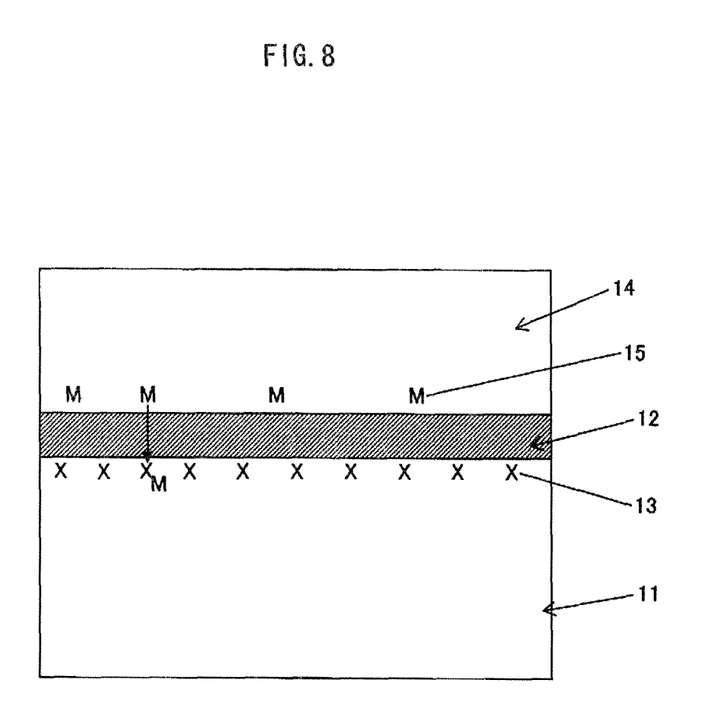
FIG. 8 illustrates a cross-sectional structure of an SOI wafer provided with a gettering ability in a conventional technology.

For example, Patent Literature 1 proposes a structure of an SOI wafer in which defects are exposed by oxygen precipitation or laser irradiation in the vicinity of a surface of a silicon wafer to be a supporting substrate, and the defects to be gettering layers are placed immediately under the BOX layer. Also, Patent Literature 2 proposes an SOI structure in which a gettering layer is formed immediately under the BOX layer by causing oxygen to be precipitated on an uppermost surface of a silicon substrate as a supporting substrate (see FIG. 8).

According to the technologies of these related documents, a gettering site can be formed relatively easily due to the structure where oxygen precipitation or a defect is introduced on a supporting substrate in the SOI wafer, but the BOX layer is present between the S layer and the gettering site, generally the diffusion coefficient of metal impurities is smaller in the silicon oxide layer than in silicon, and the diffusion coefficient of metal impurities is small even in the silicon oxide layer constituting the BOX layer. Furthermore, the thickness of the BOX layer is in a range from several tens nm (thinnest) to several μm (thickest).

Therefore a heat treatment at a high temperature for a long period is required for the metal impurities contained in the S layer to diffuse into the gettering site and be captured. This restricts the process of forming a semiconductor device greatly.

In particular, when the BOX layer is thick, the gettering ability decreases greatly, and metal impurities like Fe, with which oxides are easily formed, can hardly be expected to diffuse into the silicon oxide layer, and thus are difficult to be gettered. On the other hand, metals such as Ni and Cu are expected to diffuse into the silicon oxide layer more than Fe, but it requires a heat treatment at a high temperature for a long period for the metals to be gettered.

As will be understood from the above discussion, one of the important problems to be solved with regard to the conventional SOI wafers is a low gettering ability.

Here, as another gettering method, a method called "proximity gettering" has been implemented. According to the proximity gettering, the gettering ability is given to the S layer during a manufacturing process of a semiconductor.

In one example of the proximity gettering, an impurity diffusion layer, in which a high concentration of impurities (of boron or phosphorus) are diffused, is formed around and in proximity to semiconductor devices to be formed in the S layer so that metal impurities are gettered by defects in the impurity diffusion layer. However, this method requires an additional step for forming the impurity diffusion layer in the manufacturing process of the semiconductor, rendering the manufacturing process complicated. Also, even with this proximity gettering, the gettering effect is not stable since the effect depends on the concentration of the impurities in the diffusion layer and the distance from the devices. Thus compared with general gettering methods that use oxygen precipitation or crystal defects, the gettering effect is low. Furthermore, according to this method, the diffusion layer is formed to surround the semiconductor devices. This reduces the degree of freedom in designing the semiconductor apparatus, as well as disturbing the miniaturization of the device.

It is therefore an object of the present invention to provide an SOI wafer producing an excellent gettering effect, thereby preventing metal impurities from inducing a defect in a semiconductor apparatus when manufacturing the semiconductor apparatus by using the SOI wafer.

Solution to Problem

The above object is fulfilled by an SOI wafer comprising: a supporting substrate mainly composed of a monocrystalline silicon; an insulation layer (BOX layer) being a silicon oxide layer provided on a surface of the supporting substrate; a gettering layer provided immediately on the insulation layer and mainly composed of a silicon which contains one or more of oxygen, carbon and nitrogen and contains at least oxygen; and a monocrystalline silicon layer provided immediately on the gettering layer.

The above monocrystalline silicon layer is an area in which semiconductor devices are formed, and in general, the monocrystalline silicon constituting this layer includes one or more electrically conductive impurities.

In the above SOI wafer, the gettering layer may contain germanium or an electrically conductive impurity.

In the above SOI wafer, a state of the silicon constituting the gettering layer may be one of monocrystalline, polycrystalline, noncrystalline, and a mixture of noncrystalline and polycrystalline.

In the above SOI wafer, a concentration of the oxygen contained in the gettering layer is desirably $1 \times 10^{18}$ atoms/$cm^3$ or more.

In the above SOI wafer, the gettering layer may contain carbon, and in that case, a concentration of the carbon contained in the gettering layer is preferably $3 \times 10^{16}$ atoms/$cm^3$ or more. In the above SOI wafer, the gettering layer may contain nitrogen, and in that case, a concentration of the nitrogen contained in the gettering layer is preferably $1 \times 10^{14}$ atoms/$cm^3$ or more.

In the above SOI wafer, a thickness of the monocrystalline silicon layer is preferably in a range from 1 μm to 50 μm.

In the above SOI wafer, a thickness of the gettering layer is preferably set to be smaller than a thickness of the monocrystalline silicon layer.

In the above SOI wafer, the SOI wafer may be used as a material for manufacturing a high-voltage device of 200 V or more, such as a PDP driver or an LCD driver, or as a material for manufacturing an image device, such as an image sensor, having a buried photodiode, and in either case, a thickness of the monocrystalline silicon layer is preferably in a range from 1 μm to 10 μm.

In the above SOI wafer, the SOI wafer may be used as a material for manufacturing a high-voltage device of 500 V or more, and in that case, a thickness of the monocrystalline silicon layer is preferably in a range from 10 μm to 50 μm.

The above SOI wafer can be manufactured by the following manufacturing method.

(1) A manufacturing method of an SOI wafer, comprising: a first wafer forming step of forming a first wafer by forming a monocrystalline silicon layer and a gettering layer in sequence on a first supporting substrate, the gettering layer being mainly composed of a silicon which contains one or more of oxygen, carbon and nitrogen and contains at least oxygen; a second wafer forming step of forming a second wafer by forming an insulation layer on a surface of a second supporting substrate mainly composed of a monocrystalline silicon, the insulation layer being a silicon oxide layer; a bonding step of bonding the first wafer with the second wafer by bonding a surface of the gettering layer of the first wafer with a surface of the insulation layer of the second wafer; and a removing step of removing the first supporting substrate from the wafers bonded in the bonding step.

(2) A manufacturing method of an SOI wafer, comprising: a first wafer forming step of forming a first wafer on a first supporting substrate by forming a monocrystalline silicon layer and then implanting ions of one or more of oxygen, carbon and nitrogen including at least oxygen into an area (an area where the gettering layer is planned to be formed) in a vicinity of a surface of the monocrystalline silicon layer, by an ion implanting method; a second wafer forming step of forming a second wafer by forming an insulation layer on a surface of a second supporting substrate, the insulation layer being a silicon oxide layer, and the second supporting substrate being a monocrystalline silicon substrate; a bonding step of bonding the first wafer with the second wafer by bonding a surface of the insulation layer of the second wafer with a surface of the first wafer which is closer to the area into which the ions are implanted than another surface of the first wafer; and a removing step of removing the first supporting substrate from the wafers bonded in the bonding step.

In the above manufacturing method of an SOI wafer, when the ions are implanted in the first wafer forming step, it is preferable that the ions are implanted with an acceleration energy having been set so that a peak concentration is located in an area in a vicinity of a surface of the first supporting substrate, and 80% or more of a total dose amount of implanted ions are present in the area in a vicinity of the surface of the first supporting substrate.

(3) A manufacturing method of an SOI wafer, comprising: a first wafer forming step of forming a first wafer by forming a monocrystalline silicon layer and a polycrystalline or noncrystalline silicon layer in sequence on a first supporting substrate, and then implanting ions of one or more of oxygen, carbon and nitrogen including at least oxygen into the polycrystalline or noncrystalline silicon layer; a second wafer forming step of forming a second wafer by forming an insulation layer on a surface of a second supporting substrate, the insulation layer being a silicon oxide layer, and the second supporting substrate being a monocrystalline silicon substrate; a bonding step of bonding the first wafer with the second wafer by bonding a surface of the polycrystalline or noncrystalline silicon layer of the first wafer with a surface of the insulation layer of the second wafer; and a removing step of removing the first supporting substrate from the wafers bonded in the bonding step.

In the above manufacturing method of an SOI wafer, when the ions are implanted in the first wafer forming step, it is preferable that the ions are implanted with an acceleration energy having been set so that a peak concentration is located in the polycrystalline or noncrystalline silicon layer, and 80% or more of a total dose amount of implanted ions are present in the polycrystalline or noncrystalline silicon layer.

(4) A manufacturing method of an SOI wafer, comprising: a first wafer forming step of forming a first wafer by subjecting a first supporting substrate to a heat treatment, thereby causing oxygen to precipitate on a surface of the first supporting substrate, the first supporting substrate being mainly composed of a monocrystalline silicon in which one or more of oxygen, carbon and nitrogen including at least oxygen is contained between lattices; a second wafer forming step of forming a second wafer by forming an insulation layer on a surface of a second supporting substrate, the insulation layer being a silicon oxide layer, and the second supporting substrate being a monocrystalline silicon substrate; a bonding step of bonding the first wafer with the second wafer by bonding a surface of the insulation layer of the second wafer with the surface of the first wafer on which oxygen is precipitated; a removing step of removing an outer surface portion of the first supporting substrate from the wafers bonded in the bonding step; and a silicon epitaxial layer forming step of forming a monocrystalline silicon epitaxial layer on the first supporting substrate after the removing step.

The above manufacturing method of an SOI wafer may further comprise: a hydrogen ion implanting step of implanting hydrogen ions into a predetermined depth of the first wafer formed in the first wafer forming step, the hydrogen ion implanting step being performed before the bonding step, wherein it is preferable to remove the first wafer by subjecting the bonded wafers to a heat treatment, thereby causing a hydrogen embrittlement and a hydrogen gas to occur at the predetermined depth, in the removing step.

In the above manufacturing method of an SOI wafer, a density of oxygen precipitated in the first wafer, namely the number of BNDs (Bulk Micro Defects) that occur by the oxygen precipitation per unit volume in the first wafer forming step is preferably in a range from $5\times10^5$ pieces/cm$^2$ to $5\times10^7$ pieces/cm$^2$.

The above object is also fulfilled by a manufacturing method of a semiconductor apparatus, the semiconductor apparatus being manufactured with the above SOI wafer being used as a material, the manufacturing method comprising: a device forming step of forming a semiconductor device and a wiring in a monocrystalline silicon layer in the SOI wafer.

The above object is further fulfilled by a manufacturing method of a semiconductor apparatus, the semiconductor apparatus being manufactured with the above SOI wafer being used as a material, the manufacturing method comprising: a first wafer forming step of forming a first wafer by forming semiconductor devices and a wiring in a monocrystalline silicon layer in the SOI wafer, the semiconductor devices including a buried semiconductor device; a bonding step of bonding the first wafer with a second supporting substrate by bonding an insulation layer of the first wafer with the second supporting substrate, the second supporting substrate being mainly composed of a monocrystalline silicon; a removing step of removing the supporting substrate, the insulation layer, the gettering layer, and a part of the monocrystalline silicon layer of the first wafer, from the first wafer and the second supporting substrate bonded in the bonding step; a protection layer forming step of forming a protection layer on a surface of the monocrystalline silicon layer after the removing step; and an extraction electrode forming step of forming an extraction electrode by forming a through via that extends from an outer surface of the second supporting substrate to the wiring, passing through the second supporting substrate.

In the above manufacturing method of a semiconductor apparatus, an insulation layer may be formed on a surface of the second wafer which is bonded with the first wafer, but the insulation layer may not be formed as well.

Advantageous Effects of Invention

According to the above structure of the present invention, the gettering layer, which is mainly composed of a silicon which contains one or more of oxygen, carbon and nitrogen and contains at least oxygen, is provided immediately under the monocrystalline silicon layer. When this structure is heated, oxygen is precipitated in the gettering layer and a gettering site is formed. If the gettering layer contains carbon and/or nitrogen as well as oxygen, the carbon and/or nitrogen functions to promote the precipitation of oxygen.

As explained above, according to the present invention, a gettering site is formed in a layer adjacent to a monocrystalline silicon layer. Thus it exerts a strong gettering ability on the monocrystalline silicon layer.

On the other hand, the monocrystalline silicon layer, in which semiconductor devices are formed, is a different layer from the gettering layer, and there is no need for the monocrystalline silicon layer to contain oxygen. Thus with the above structure, it is possible to restrict the precipitation of oxygen in the monocrystalline silicon layer, and keep the monocrystalline silicon layer high-quality with little defect.

Also, according to the present invention, the gettering layer is formed in the SOI wafer in which semiconductor devices have not been formed. Thus the structure eliminates the need to perform a step of forming an impurity diffusion layer in proximity to semiconductor devices as in the "proximity gettering", in the process of forming the semiconductor devices in the monocrystalline silicon layer. In this respect, the degree of freedom in designing the semiconductor apparatus is ensured.

Furthermore, according to the manufacturing method of an SOI wafer of the present invention, it is possible to manufacture, at a low cost and with good productivity, the SOI wafer having the above structure of the present invention, namely, the SOI wafer having a strong gettering ability.

Also, according to the manufacturing method of a semiconductor apparatus of the present invention, it is possible to manufacture a semiconductor apparatus provided with a strong gettering ability by using the above SOI wafer of the present invention. As a result, it is possible to manufacture semiconductor devices having an excellent electric property and reliability.

In particular, a general semiconductor apparatus having a buried device such as a solid-state imaging device is susceptible to influence by the metal impurities. However, according to the manufacturing method of a semiconductor apparatus of the present invention, it is possible to restrict the influence by the metal impurities during the process of manufacturing a semiconductor apparatus having a buried device. Therefore the manufacturing method of a semiconductor apparatus of the present invention produces a great effect of improving the electric property and the reliability.

DESCRIPTION OF EMBODIMENTS

The following describes an SOI wafer having a function to getter impurities, in one embodiment of the present invention with reference to the drawings.

[Structure of SOI Wafer 10]

Figure 1:
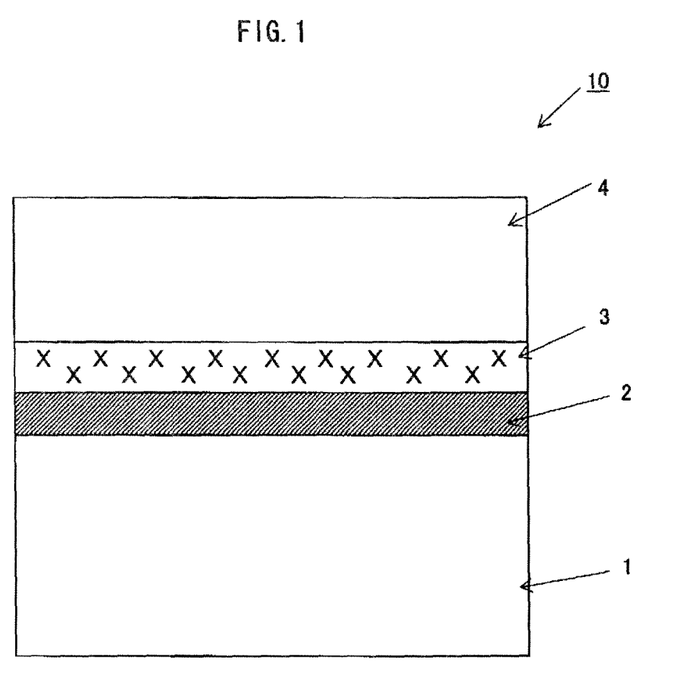
FIG. 1 illustrates a cross-sectional structure of the SOI wafer in an embodiment.

As shown in FIG. 1, in an SOI wafer 10 of the present embodiment, a BOX (Buried OXide) layer 2 being a silicon oxide layer has been formed in an upper part of a supporting silicon substrate 1 mainly composed of a monocrystalline silicon wafer. The BOX layer 2 is an oxide layer formed on a surface of a monocrystalline silicon wafer by thermally oxidizing the silicon wafer.

A gettering layer 3, mainly composed of silicon including oxygen, is formed on the BOX layer 2, and an S layer 4, mainly composed of a monocrystalline silicon for forming devices, is formed on the gettering layer 3. When the SOI wafer 10 is heated, a gettering site is formed within the gettering layer 3 by the oxygen precipitation, the gettering site having an effect to capture metal impurities contained in the S layer 4.

Typically, one or more electrically conductive dopants (phosphorus, arsenic, boron or the like) are contained in the monocrystalline silicon wafer constituting the supporting silicon substrate 1. However, for usage involving high frequencies, a highly resistive substrate, which does not contain any of the electrically conductive dopants with intention, may be used.

The supporting silicon substrate 1 does not need to have the gettering function. Accordingly, the supporting silicon substrate 1 is defined not to contain oxygen, nitrogen, or carbon. The supporting silicon substrate 1 may contain a lot of oxygen precipitation nuclei, or may not contain oxygen precipitation nucleus at all. According to a normal manufacturing method of a monocrystalline silicon wafer, it contains oxygen and carbon.

The thickness of the BOX layer 2 is determined depending on what semiconductor device is manufactured with use of the SOI wafer 10 as a material. In general, the thickness of the BOX layer 2 is in a range from 50 nm to several μm.

The gettering layer 3, as described above, is made of silicon containing oxygen. With regard to the format in which oxygen is contained in silicon, oxygen alone may be contained, or oxygen may be contained in combination with carbon, or nitrogen, or both of carbon and nitrogen.

During a high-temperature heating, oxygen is precipitated from silicon and a gettering site is formed in the gettering layer 3. If carbon and/or nitrogen is contained together with oxygen in the gettering layer 3, the carbon and/or nitrogen functions to promote the precipitation of oxygen.

Since no semiconductor device is formed in the gettering layer 3, the gettering layer 3 may have any quality of crystals. That is to say, the gettering layer 3 may have a monocrystalline silicon, a noncrystalline silicon, a polycrystalline silicon, or a mixture of a noncrystalline silicon and a polycrystalline silicon. As will be described later, silicon constituting the gettering layer 3 can take various forms depending on the manufacturing method of the gettering layer 3.

If silicon crystals constituting the gettering layer 3 have a disorder of crystals such as a defect, oxygen precipitation, distortion, or crystal grain boundary, such a disorder of crystals may function as a gettering site and contribute to the improvement of the gettering function.

For example, if the gettering layer 3 contains germanium (Ge), a lattice of the silicon crystal is distorted, and the distortion functions as a gettering site. Also, if the gettering layer 3 contains boron (B), the gettering layer 3 additionally has a gettering function by boron.

With regard to the concentration of oxygen contained in the gettering layer 3 (the concentration of oxygen between lattices if oxygen is contained in silicon crystals), the higher the oxygen concentration is, the more oxygen is precipitated in the heat treatment process, and thus the gettering layer 3 more acts as a gettering site. In view of this, a preferable oxygen concentration is $1\times10^{18}$ atoms/cm$^3$ or more. On the other hand, although the upper limit of the oxygen concentration is not determined in particular, a realistic upper limit thereof will be $2\times10^{18}$ atoms/cm$^3$.

When the gettering layer 3 contains carbon, it is preferable, from the view point of promoting the oxygen precipitation, that the carbon concentration is $3\times10^{16}$ atoms/cm$^3$ or more, or $1\times10^{18}$ atoms/cm$^3$ or less.

When the gettering layer 3 contains nitrogen, nitrogen has a function to increase the density of oxygen precipitation nucleus. It is preferable that the nitrogen concentration is $5\times10^{13}$ atoms/cm$^3$ or more, or $5\times10^{14}$ atoms/cm$^3$ or less.

Note that the oxygen concentration and carbon concentration can be measured by the infrared absorption spectrometry, and the nitrogen concentration can be measured by SIMS.

The thicker the gettering layer 3 is, the larger the total amount of metal impurities to be gettered is; and the thinner the gettering layer 3 is, the smaller the total amount of metal impurities to be gettered is. In this sense, a sufficient thickness of the gettering layer 3 is required to keep a sufficient gettering function. However, when the function of the SOI wafer is taken into account, it is unlikely, except for a special case, that the gettering layer 3 is set to be thicker than the S layer 4. Usually, the gettering layer 3 is set to be equal to or thinner than the S layer 4.

The S layer 4 is a layer mainly composed of a monocrystalline silicon, and contains electrically conductive impurities (phosphorus, arsenic, and boron). Since semiconductor devices are to be formed in the S layer 4, it is preferable that the S layer 4 has no defective, and has a low concentration of oxygen between lattices.

Also, since it is preferable that the oxygen precipitation does not occur in the S layer 4 by the heating process, it is preferable that the gettering layer 3 and the S layer 4 have different silicon structures.

The layer thickness of the S layer 4 is determined on the basis of the requirement of device design, and is in a range from 10 nm to several tens μm, which is, however, several tens times less than the thickness of the supporting substrate (silicon substrate).

For example, when the SOI wafer 10 is used as a material for manufacturing an imaging device such as a CCD or CMOS image sensor, an appropriate thickness of the S layer 4 is in a range from 2 μm to 8 μm; when the SOI wafer 10 is used as a material for manufacturing an MOS device of a full depletion type (FD type), an appropriate thickness of the S layer 4 is in a range from 20 nm to 50 nm; and when the SOI wafer 10 is used as a material for manufacturing an MOS device of a partial depletion type (PD type), an appropriate thickness of the S layer 4 is in a range from 50 nm to 300 nm.

On the other hand, when the SOI wafer 10 is used as a material for manufacturing a high-voltage device of 200 V or more, such as a PDP (Plasma Display Panel) driver or an LCD (Liquid Crystal Display) driver, the thickness of the S layer 4 is set to be large, in a range from 1 μm to 5 μm. Furthermore, when the SOI wafer 10 is used as a material for manufacturing a high-voltage electric device of more than 1000 V, the thickness of the S layer is set to be large, in a range from 10 μm to 50 μm, and the thickness of the BOX layer is also set to be large, in a range from 1 μm to 2 μm.

When the layer thickness of the S layer 4 is set to be relatively small, approximately in a range from 20 nm to 300 nm, the gettering layer 3 needs to be thin as well. However, when the S layer 4 is 1 μm or more, the gettering layer 3 can be set to any thickness, not exceeding the thickness of the S layer 4, with which metal impurities that enter the S layer 4 can be gettered. This makes it possible to form the gettering layer 3 relatively easily.

[Effects Produced by SOI Wafer 10]

When the SOI wafer 10 is subjected to the heating process, oxygen contained in the gettering layer 3 precipitates in the silicon constituting the gettering layer 3, and acts as a gettering site.

Note that since the gettering layer 3, which has the gettering characteristic, is formed under the S layer 4 in which devices are formed, with no BOX layer between the gettering layer 3 and the S layer 4, atoms of metal impurities contained in the S layer 4 are efficiently diffused into the gettering layer 3, and captured by the gettering site formed in the gettering layer 3.

Accordingly, the SOI wafer 10 has a high ability to getter metal impurities that are present in the S layer 4.

Thus, a semiconductor apparatus, in which semiconductor devices have been formed in the S layer 4 of the SOI wafer 10, can prevent the metal impurities from inducing a crystal defect, a junction leakage in the PN-junction, or an insulation breakdown in the oxide layer.

On the other hand, the S layer 4 is mainly composed of a monocrystalline silicon, and is a layer independent of the gettering layer 3. Thus, even if the SOI wafer 10 is subjected to the heating process, oxygen is not precipitated in the S layer 4, and an excellent crystal structure thereof is maintained.

Note that, when the SOI wafer 10 is provided, a gettering site may not necessarily have been formed in the gettering layer 3. A gettering site may be formed in the gettering layer 3 when a device is manufactured using the SOI wafer 10. When a high-temperature heating process is performed after the gettering layer 3 and the S layer 4 are formed during a manufacturing process of the SOI wafer 10, the manufactured SOI wafer 10 exerts the gettering characteristic from the begging. Otherwise, the manufactured SOI wafer 10 exerts the gettering characteristic after the high-temperature heating process is performed during a manufacturing process of a semiconductor device.

Accordingly, if a high gettering characteristic is required from the beginning of a manufacturing process of a semiconductor device, a heating process exceeding 1000° C. may be performed before the manufacturing process of a semiconductor device, or as the first step of the manufacturing process.

[Manufacturing Method of SOI Wafer]

As manufacturing methods of the SOI wafer 10 having the above structure, manufacturing methods 1-4 are explained in the following.

[Manufacturing Method 1]

FIGS. 2A through 2D show manufacturing steps of an SOI wafer by the manufacturing method 1.

Figure 2A:
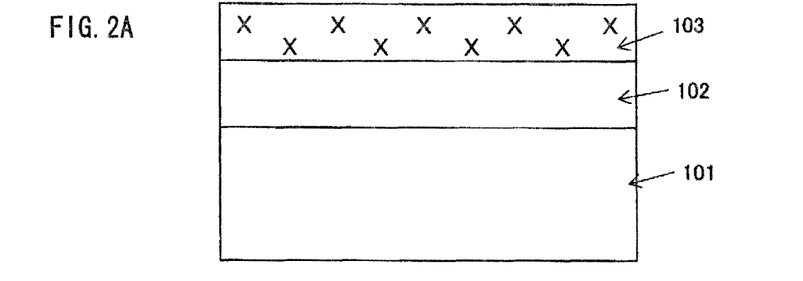
FIGS. 2A-2D illustrate a manufacturing method of the SOI wafer in the embodiment.

First Wafer Forming Step:

As shown in FIG. 2A, a first wafer to be a donor wafer is formed.

Any substrate may be used as a first supporting substrate 101 as far as the substrate is a monocrystalline silicon substrate. It is presumed here that a CZ silicon substrate, in which oxygen has been doped with a concentration of $1.2 \times 10^{18}$ atoms/cm$^3$ and boron has been doped with a concentration of $1.5 \times 10^{15}$ atoms/cm$^3$, is used as the first supporting substrate 101.

On the first supporting substrate 101, an S layer 102 is formed by the vapor phase epitaxial method, the S layer 102 having a thickness of 5 μm and being mainly composed of a silicon containing boron with a concentration of $1 \times 10^{15}$ atoms/cm$^3$. Subsequent to this, on the S layer 102, a gettering layer 103 is formed by the vapor phase epitaxial method, the gettering layer 103 being mainly composed of a silicon containing oxygen or a combination of oxygen, nitrogen and carbon.

In the present example, the gettering layer 103 is mainly composed of a silicon containing a combination of oxygen and carbon. However, the silicon may contain oxygen as a single separate material, or a combination of oxygen and nitrogen, or a combination of oxygen, nitrogen and carbon. In those cases, as in the above example, each element can be entered during the vapor phase epitaxial step.

Also, boron is doped into a silicon constituting the gettering layer 103, with a boron concentration of $1 \times 10^{15}$ atoms/cm$^3$.

With the above steps, two layers, namely, the S layer 102 (5 μm thick) and the gettering layer 103 (1 μm thick), which is mainly composed of a silicon containing oxygen and carbon, are formed on the first supporting substrate 101.

Figure 2B:
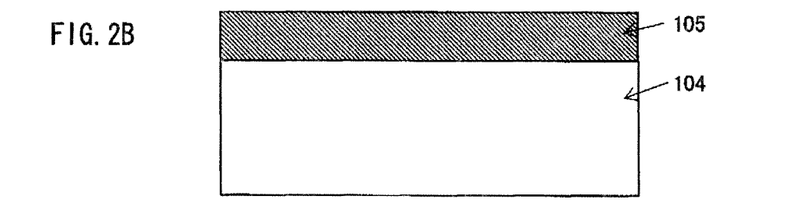

Second Wafer Forming Step:

As shown in FIG. 2B, a second wafer to be a handle wafer is formed.

A monocrystalline silicon wafer to be a second supporting substrate is prepared and thermally oxidized, so that a silicon oxidized layer 105 having a thickness of 300 nm is formed on a surface of a second supporting substrate 104.

As the silicon wafer to be a supporting substrate, a P-type silicon wafer (doped with a boron concentration of $1.5 \times 10^{15}$ atoms/cm$^3$) having an electrical resistivity of 10-15 Ωcm, and in which oxygen and nitrogen were doped (with an oxygen concentration of $1.6 \times 10^{18}$ atoms/cm$^{13}$ and a nitrogen concentration of $4 \times 10^{15}$ atoms/cm$^3$) was used.

Figure 2C:
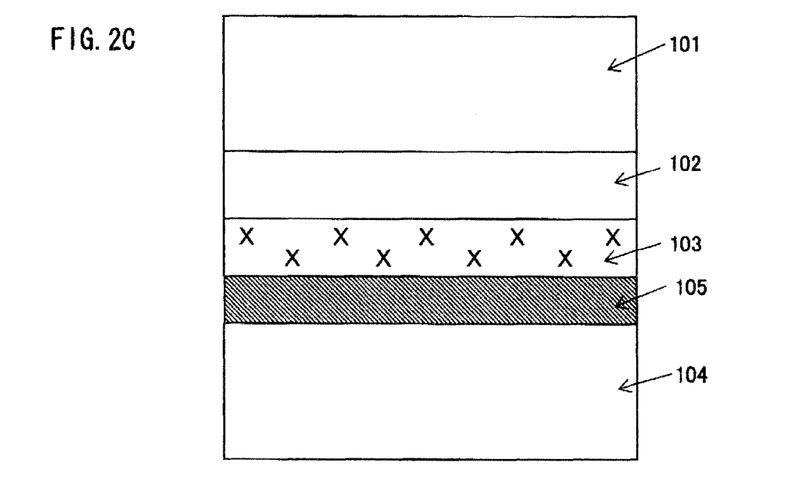

Bonding Step:

The first and second wafers are bonded together by bonding the gettering layer 103 with the silicon oxidized layer 105. The bonded wafers are subjected to a heat treatment at 600° C. to increase the bonding strength. As a result, as shown in FIG. 2C, the wafers are bonded with each other, with the second wafer placed on the first wafer.

Figure 2D:
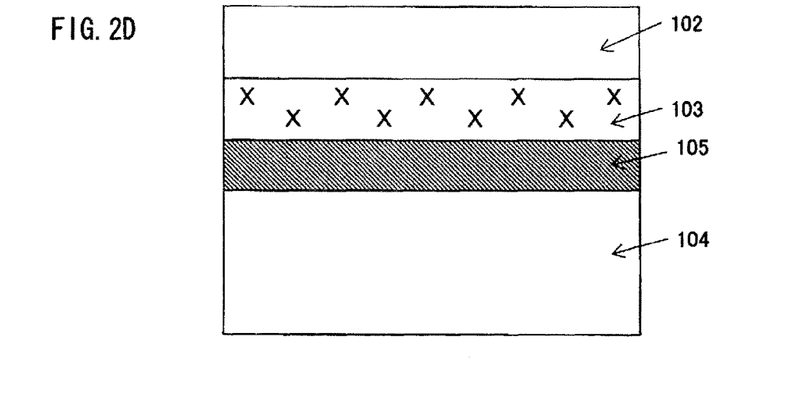

Polishing Step:

Subsequent to the bonding step, the bonded wafers are polished by the chemical mechanical polishing method, starting with the back surface of the first wafer (a surface of the first supporting substrate 101). In this polishing step, after the first supporting substrate 101 is polished away entirely, 1 μm out of 5 μm in thickness of the S layer 102 is polished away.

Through the above steps, an SOI wafer is manufactured, the SOI wafer including: the second supporting substrate 104; the BOX layer 105 which is the silicon oxidized layer formed on a surface of the second supporting substrate 104 and has a thickness of 300 nm; the gettering layer 103 which, formed on a surface of the BOX layer 105, has a thickness of 1 μm and is mainly composed of a silicon containing oxygen and nitrogen; and the S layer 102 which, formed on a surface of the gettering layer 103, has a thickness of 4 μm and is mainly composed of a monocrystalline silicon.

Subsequent to this, the SOI wafer is subjected to a heat treatment at 750° C. for two hours and further to a heat treatment at 1000° C. for two hours to stabilize the surface. With these heat treatments, the S layer 102 maintains the excellent crystal structure, while oxygen is precipitated in the gettering layer 103 which is placed immediately under the S layer 102. The density of oxygen precipitated in the gettering layer 103 is, for example, $5 \times 10^6$ pieces/cm$^2$.

[Manufacturing Method 2]

FIGS. 3A through 3D show manufacturing steps of an SOI wafer by the manufacturing method 2.

In the present manufacturing method, as in manufacturing method 1, an SOI wafer is manufactured by bonding a donor wafer with a handle wafer. The present manufacturing method differs from manufacturing method 1 in that it forms the gettering layer by implanting oxygen or the like into the wafer from the surface of the silicon layer by the ion implantation.

Figure 3A:
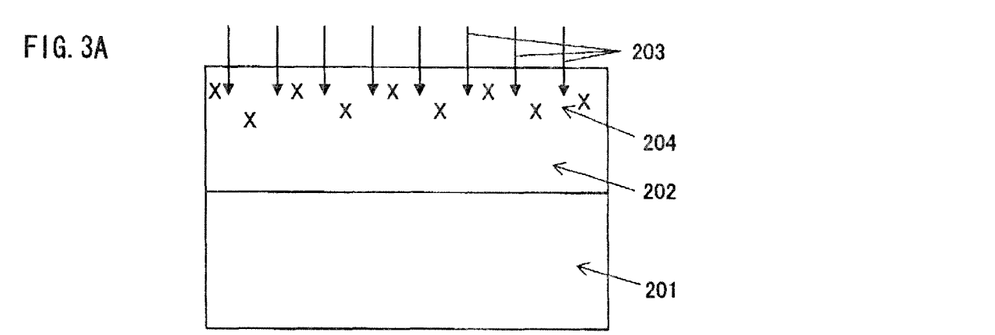
FIGS. 3A-3D illustrate a manufacturing method of the SOI wafer in the embodiment.

First Wafer Forming Step:

First, the first wafer to be the donor wafer is prepared. In this preparation, as shown in FIG. 3A, on a first supporting substrate 201, a silicon epitaxial layer 202 is formed by the vapor phase epitaxial method, the silicon epitaxial layer 202 having thickness of 6 μm and containing boron with a concentration of $1 \times 10^{15}$ atoms/cm$^3$. The first supporting substrate 201 used here is not limited in particular.

Note that, although the silicon epitaxial layer 202 is to be divided into an S layer 202a and a gettering layer 204 in a later step, it has not been divided so at this stage.

Next, as shown in FIG. 3A, oxygen (as well as nitrogen, carbon or the like) is implanted into the wafer from the surface of the silicon epitaxial layer 202. For this operation, the acceleration energy is set such that a sum of a mean range (Rp) and a variation ΔRp of each ion (oxygen, nitrogen, carbon or the like) falls within the range of the thickness (1 μm) of the region in which the gettering layer 204 is to be formed later.

Note that it is acceptable if, among the total amount of implanted ions, 80% or more of oxygen ions, nitrogen ions, and carbon ions are contained in a 1 μm thick region of the gettering layer 204. That is to say, even if a bottom part of the ion range added with the mean range (Rp) and variation ΔRp enters the S layer 202a, it is acceptable if the amount of the entered bottom part is less than 20% of the total amount of implanted oxygen ion, nitrogen ion, and carbon ion.

In this example, first, oxygen ions are implanted with 225 keV of acceleration energy for the mean range (Rp) of the implantation to be 0.5 μm, and then nitrogen ions are implanted with 225 keV of acceleration energy for the mean range (Rp) to be 0.5 μm. It is presumed here that the dose amount of oxygen ions is $1.6 \times 10^{14}$ atoms/cm$^2$, and the dose amount of nitrogen ions is $1 \times 10^{12}$ atoms/cm$^2$. Note that values of ΔRp for 225 keV of oxygen and 225 keV of nitrogen are set to be 80 nm and 113 nm, respectively, so that there is no problem in implanting the ions into a region of 1 μm in thickness, which is assumed to be the thickness of the gettering layer 204.

By implanting the oxygen ions and nitrogen ions in this way, the silicon epitaxial layer 202 is formed on the first supporting substrate 201, the formed silicon epitaxial layer 202 being 5 μm thick and to be the S layer 202a later, and on the silicon epitaxial layer 202, the gettering layer 204 which is 1 μm thick and is mainly composed of a silicon containing oxygen and nitrogen is formed.

In the above implantation of oxygen ions and nitrogen ions, ions may be implanted into two to three depths within the thickness of the gettering layer 204, depending on the circumstances. For example, on the presumption that the thickness of the gettering layer 204 to be formed is 1 μm, oxygen ions and nitrogen ions are implanted into each of three depths by implanting oxygen ions with 110 keV, 225 keV, and 375 keV of acceleration energy for three mean ranges to be 0.25 μm, 0.5 μm, and 0.75 μm (the dose amount is $5.3 \times 10^{13}$ atoms/cm$^2$), and then implanting nitrogen ions with 100 keV, 225 keV, and 375 keV of acceleration energy for three mean ranges to be the same (the dose amount is $3.4 \times 10^{11}$ atoms/cm$^2$). Here, when oxygen ions and nitrogen ions are implanted into the deepest position (0.75 μm), values of ΔRp are 0.15 μm and 0.14 μm, respectively. Since the sum of the ΔRp and implantation depth Rp is 0.9 μm in this example, the implanted ions can be housed in a 1 μm thick region of the gettering layer 204.

Also, when carbon ions are implanted into depths of 0.25 μm, 0.5 μm, and 0.75 μm, it is implanted with 90 keV, 200 keV, and 325 keV of acceleration energy, respectively.

By implanting ions into each of the depths in this way, it is possible to unify the concentration distributions of oxygen, nitrogen and carbon in a plurality of depths in the gettering layer 204 in the depth direction.

Figure 3B:
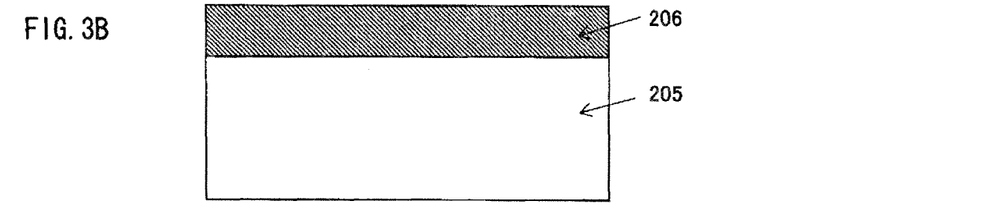

Second Wafer Forming Step:

As shown in FIG. 3B, a second wafer to be a handle wafer is formed.

The second wafer is manufactured by thermally oxidizing the surface of the monocrystalline silicon substrate (silicon wafer) to form a silicon oxide layer having a thickness of 200 nm, the silicon oxide layer being to be a BOX layer 206. As the silicon wafer, a highly resistive wafer which is non-dope and has 1000 Ωcm of electrical resistivity is used.

Figure 3C:
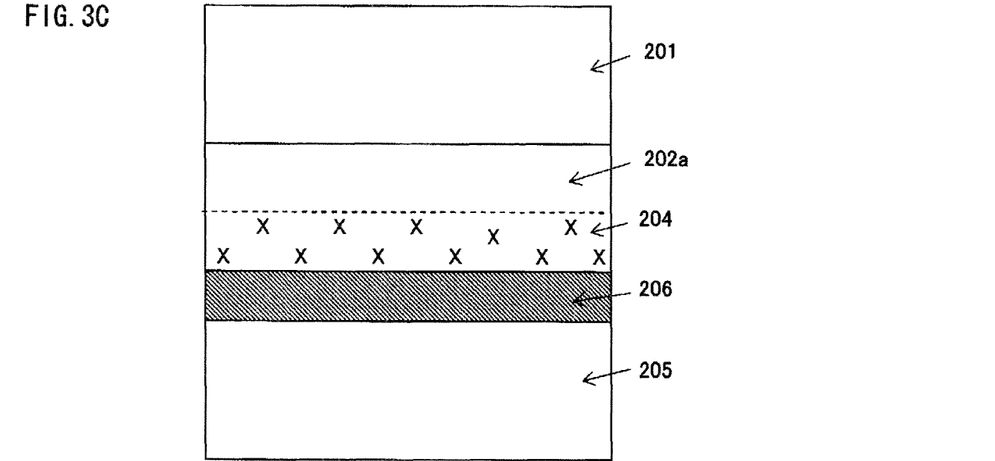

Bonding Step:

The first and second wafers are bonded together by bonding the S layer 202a with the BOX layer 206, and the bonded wafers are subjected to a heat treatment at 600° C. to increase the bonding strength. As shown in FIG. 3C, the bonded wafers have a structure in which, on the BOX layer 206 of a supporting substrate 205, the gettering layer 204, the S layer 202a mainly composed of a monocrystalline silicon, and the first supporting substrate 201 are stacked in this order.

Figure 3D:
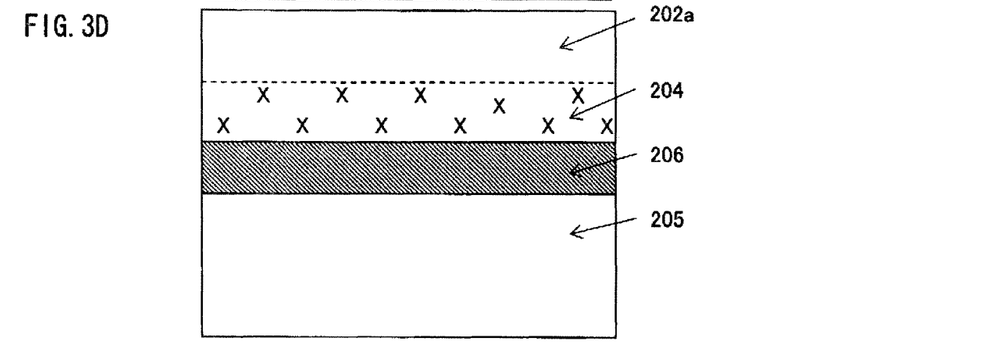

Polishing Step:

Subsequent to the bonding step, the bonded wafers are polished by the chemical mechanical polishing method, starting with the back surface of the first wafer (a surface of the first supporting substrate 201), and after the first supporting substrate 201 is polished away entirely, 1 μm out of 5 μm in thickness of the S layer 202a is polished away.

The present state is shown in FIG. 3D, where the BOX layer 206 which is the silicon oxidized layer has been formed on a surface of the second supporting substrate 205, the gettering layer 204 having a thickness of 1 μm has been formed on a surface of the BOX layer 206, and the S layer 202a having a thickness of 4 μm has been formed on a surface of the gettering layer 204. Subsequent to this, the wafer is subjected to a heat treatment at 1000° C. for two hours to stabilize the surface. With the above heat treatments, oxygen is precipitated in the gettering layer 204 which is placed immediately under the S layer 202a. The density of oxygen precipitated in the gettering layer 204 is, for example, $5 \times 10^6$ pieces/cm$^2$.

By implanting ions into each of the plurality of depths and unifying the ion concentration distributions in the depth direction in the gettering layer 204 as described above, it is possible to increase the ion concentration in the gettering layer 204 as a whole along the depth direction, while restricting the ion concentration in the S layer 202a to a low level.

Accordingly, it is possible to improve the gettering function by forming a high-density gettering site in the gettering layer 204, while maintaining an excellent crystal structure of the S layer 202a.

[Manufacturing Method 3]

In the present manufacturing method, a gettering layer is formed by implanting oxygen ions or the like into a noncrystalline or polycrystalline silicon layer. A noncrystalline or polycrystalline silicon layer itself, in particular, a polycrystalline silicon layer itself functions as a gettering site, thus increasing the gettering function of the gettering layer.

FIGS. 4A through 4D show manufacturing steps of an SOI wafer by the manufacturing method 3.

Figure 4A:
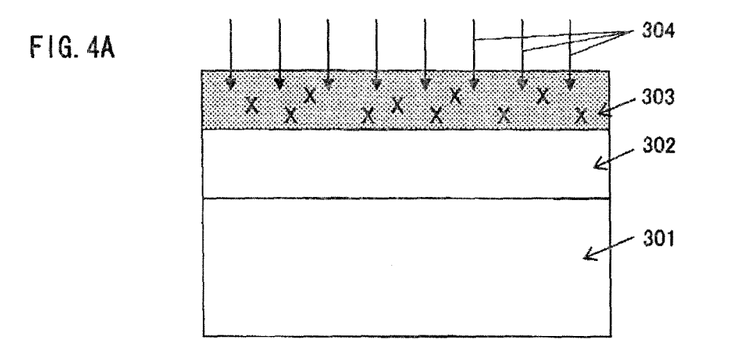
FIGS. 4A-4D illustrate a manufacturing method of the SOI wafer in the embodiment.

First Wafer Forming Step:

To manufacture a first wafer to be a donor wafer, first a first supporting substrate 301 is prepared. Any substrate may be used as a first supporting substrate 301 as far as the substrate is a monocrystalline silicon substrate.

As shown in FIG. 4A, on the first supporting substrate 301, a silicon epitaxial layer (an S layer 302) is formed by the vapor phase epitaxial method, the silicon epitaxial layer having thickness of 5 μm and containing boron with a concentration of $1 \times 10^{15}$ atoms/cm$^3$. Subsequent to this, a silicon layer 303, which is mainly composed of a non-dope polycrystalline silicon or a noncrystalline (amorphous) silicon and has a thickness of 1 μm, is formed on the S layer 302.

The S layer 302 and the silicon layer 303 can be formed by a vapor phase method, such as the CVD method, by forming the layers under different conditions. That is to say, it is possible to form a monocrystalline, polycrystalline, or noncrystalline silicon layer by adjusting the conditions such as the temperature when forming the silicon layer.

In general, a monocrystalline silicon is apt to be formed at a high temperature of 570° C. or more, and a polycrystalline or noncrystalline silicon is apt to be formed at a low temperature of 550° C. or less.

Note however that, when an attempt is made to stack a polycrystalline or noncrystalline silicon on a monocrystalline silicon epitaxial layer, an epitaxial single crystals may grow depending on the state of the surface, even if a polycrystalline or noncrystalline silicon would be formed in general under the same conditions. Thus the conditions need to be set with sufficient care.

Next, oxygen (and nitrogen and carbon) ions 304 are implanted into the wafer from the surface of the polycrystalline or noncrystalline silicon layer 303, providing the silicon layer 303 with oxygen and the like to form a gettering layer 305.

In this example, ions of oxygen and nitrogen are implanted. However, not limited to this, ions of oxygen alone, or ions of oxygen and carbon, or ions of oxygen, nitrogen and carbon may be implanted.

When ions of oxygen and nitrogen are implanted into the silicon layer 303, as explained in "Manufacturing method 2", an acceleration energy is set such that a sum of a mean range (Rp) and a variation ΔRp of each ion (oxygen, nitrogen, carbon or the like) falls within the range of the thickness of the silicon layer 303. It should be noted here that it is acceptable if 80% or more of the total amount of implanted ions of oxygen and nitrogen are contained in a 1 μm thick region of the silicon layer 303, and that even if a bottom part of the ion range enters the S layer, it is acceptable if the amount of the entered bottom part is less than 20% of the total amount of implanted ions.

As one example, first, oxygen ions are implanted with 225 keV of acceleration energy for the mean range (Rp) of the implantation to be 0.5 μm. Here, the dose amount of oxygen ions is presumed to be $1.6 \times 10^{14}$ atoms/cm$^2$. Next, nitrogen ions is implanted with 225 keV of acceleration energy for the mean range (Rp) to be 0.5 μm, wherein the dose amount of nitrogen ions is presumed to be $1 \times 10^{12}$ atoms/cm$^2$. Following this, carbon ions are implanted with 200 keV of acceleration energy for the mean range to be 0.5 μm, wherein the dose amount of carbon ions is presumed to be $1 \times 10^{13}$ atoms/cm$^2$.

With the above steps, the S layer 302 having a thickness of 5 μm is formed on the first supporting substrate 301, and on the S layer 302, the gettering layer 305, which has a thickness of 1 μm and is mainly composed of a polycrystalline or noncrystalline silicon containing oxygen and nitrogen, is formed.

Also, as explained in "Manufacturing method 2", ions may be implanted into two to three depths of the silicon layer 303. For example, oxygen ions are implanted into a 1 μm thick region of the silicon layer 303 for three mean ranges to be 0.25 μm, 0.5 μm, and 0.75 μm, with the dose amount $5.3 \times 10^{13}$ atoms/cm$^2$, and nitrogen ions are implanted with the dose amount of $3.4 \times 10^{11}$ atoms/cm$^2$. Furthermore, carbon ions may be implanted with the dose amount of $3.4 \times 10^{12}$ atoms/cm$^2$.

Figure 4B:
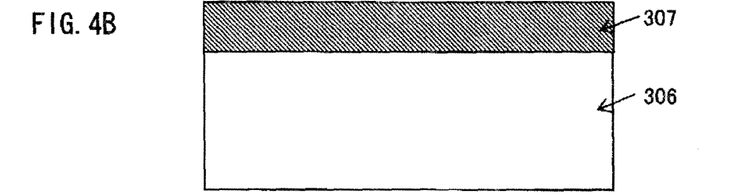

Second Wafer Forming Step:

As the second supporting substrate 306 which is mainly composed of a monocrystalline silicon, a highly resistive wafer which is non-dope and has 1000 Ωcm of electrical resistivity is used. The second wafer as a handle wafer shown in FIG. 4B is formed by thermally oxidizing the surface of the second supporting substrate 306 to form a silicon oxide layer having a thickness of 200 nm, the silicon oxide layer being to be a BOX layer 307.

Figure 4C:
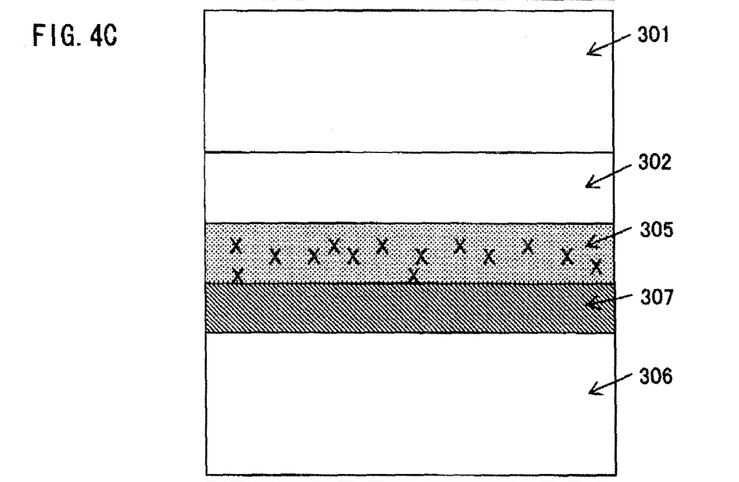

Bonding Step:

The first and second wafers are bonded together by bonding the gettering layer 305 with the BOX layer 307, and the bonded wafers are subjected to a heat treatment at 600° C. to increase the bonding strength. As shown in FIG. 4C, the bonded wafers have a structure in which, on the BOX layer 307 of a supporting substrate 306, the gettering layer 305 mainly composed of a polycrystalline or noncrystalline silicon containing oxygen and nitrogen, the S layer 302 mainly composed of a monocrystalline silicon, and the first supporting substrate 301 are stacked in this order.

Figure 4D:
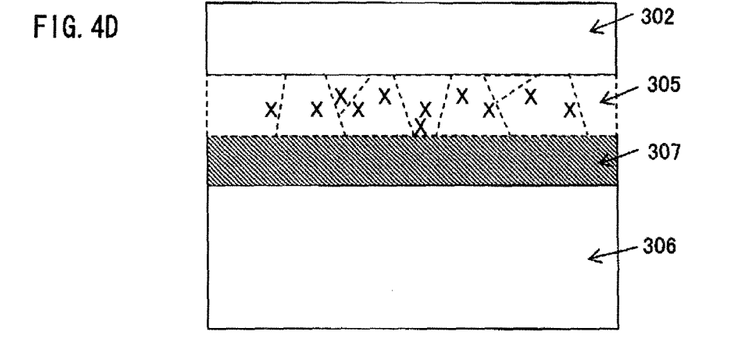

Polishing Step:

Subsequent to the bonding step, the bonded wafers are polished by the chemical mechanical polishing method, starting with the back surface of the first wafer, and after the first supporting substrate 301 is polished away entirely, 1 μm out of 5 μm in thickness of the S layer 302 is polished away.

Presently, the BOX layer 307 which is the silicon oxidized layer has been formed on a surface of the second supporting substrate 306, the gettering layer 305 having a thickness of 1 μm has been formed on a surface of the BOX layer 307, and the S layer 302 having a thickness of 4 μm has been formed on a surface of the gettering layer 305. Subsequent to this, the wafer is subjected to a heat treatment at 1000° C. for two hours to stabilize the surface. With the present heat treatment, the crystal structure of the S layer 302, which is mainly composed of a monocrystalline silicon, is maintained excellently, and oxygen is precipitated in the gettering layer 305 which is placed immediately under the S layer 302. The density of oxygen precipitated in the gettering layer 305 is, for example, $1×10^9$ pieces/cm3.

Note that, when the silicon layer 303 is mainly composed of a noncrystalline silicon and is subjected to the above heat treatment (1000° C.), the monocrystalline silicon changes into a monocrystalline or polycrystalline silicon. However, the gettering effect of the gettering layer 305 does not change basically.

[Manufacturing Method 4]

FIGS. 5A through 5D show manufacturing steps of an SOI wafer by the manufacturing method 4.

In the present manufacturing method, the gettering layer is formed using a method of removing a monocrystalline silicon substrate containing oxygen.

Figure 5A:
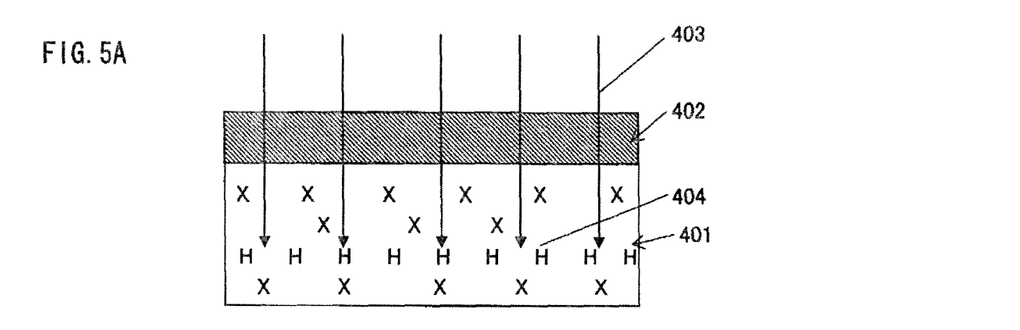
FIGS. 5A-5D illustrate a manufacturing method of the SOI wafer in the embodiment.

First Wafer Forming Step:

To manufacture a first wafer to be a donor wafer, a monocrystalline silicon substrate 301 is prepared first, the monocrystalline silicon substrate 301 containing oxygen and nitrogen with the concentration of oxygen between lattices being $1.6×10^{18}$ atoms/cm$^3$, and the concentration of nitrogen between lattices being $5×10^{14}$ atoms/cm$^3$.

The monocrystalline silicon substrate is subjected to a heat treatment at 800° C. for two hours and further to a heat treatment at 1000° C. for four hours so that oxygen is precipitated. The density of oxygen precipitated is, for example, $1×10^9$ pieces/cm$^3$.

The monocrystalline silicon substrate is thermally oxidized, so that a silicon oxidized layer, which has a thickness of 200 nm and is to be a BOX layer 402, is formed on a surface of a monocrystalline silicon substrate 401, as shown in FIG. 5A. Next, hydrogen ions are implanted into the wafer from the surface of the BOX layer 402 with 200 KeV (Rp=1.83 μm). With this operation, hydrogen ions are implanted into a depth corresponding to Rp=1.83 μm, and the hydrogen density in a hydrogen ion implanted area 404 is increased to $1×10^{16}$ atoms/cm$^3$.

Figure 5B:
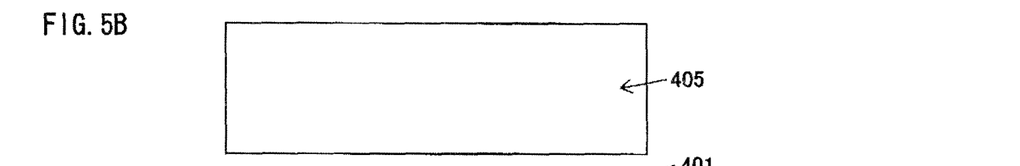

Second Wafer Preparation Step:

As shown in FIG. 5B, as a second supporting substrate 405 which is to be a handle wafer, a wafer mainly composed of a monocrystalline silicon is prepared.

Figure 5C:
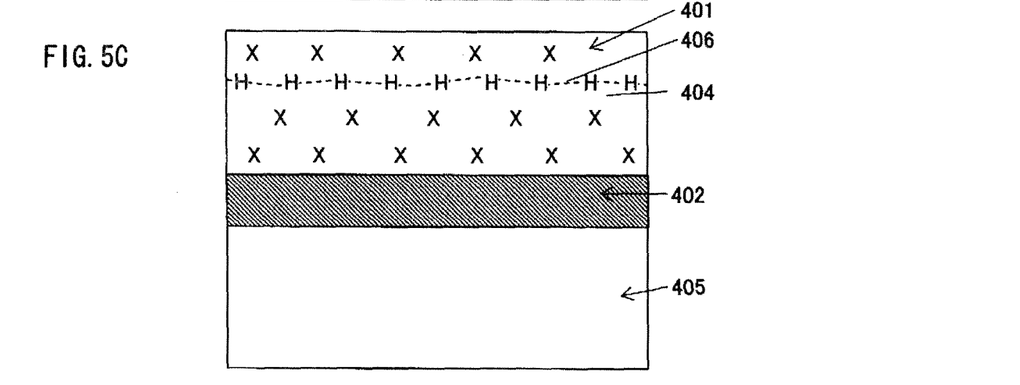

Bonding Step:

The first wafer and the second supporting substrate 405 are bonded together by bonding the BOX layer 402 with the second supporting substrate 405.

Removing Step:

Subsequent to this, the bonded wafer and substrate are subjected to a heat treatment at 600° C., so that a hydrogen embrittlement occurs and a volume expansion occurs due to a change of hydrogen atoms into gas, in the hydrogen ion implanted area 404 in the monocrystalline silicon substrate 401, and a part of the monocrystalline silicon substrate 401 is removed. The technology for the removing is known as the nano-cleaving technology or SOITEC method (Smart Cut method) (see Japanese Patent Application Publication No. 2008-263087).

Figure 5D:
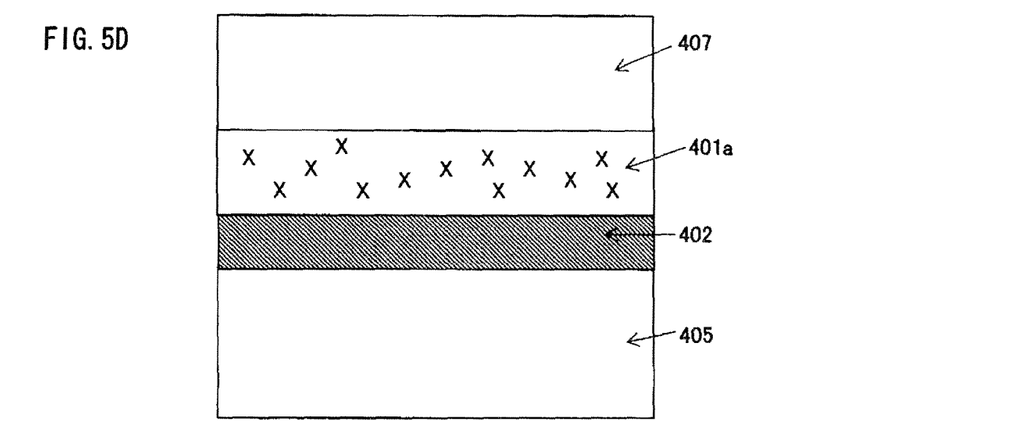

With the above removing step, it is possible to reduce the thickness of the monocrystalline silicon substrate 401, which is placed on the BOX layer 402, to a thickness appropriate for the gettering layer. After the removing step, the bonded wafer and substrate are subjected to a heat treatment for stabilization, and then the surface of the monocrystalline silicon substrate 401 after a part has been removed is polished until the layer thickness is 1 μm.

With this operation, as shown in FIG. 5D, a gettering layer 401a is formed on the BOX layer 402. Subsequent to this, on the gettering layer 401a, an S layer 407 is formed by the vapor phase epitaxial method, the S layer 407 having a thickness of 5 μm and being mainly composed of a monocrystalline silicon containing boron with a concentration of $1×10^{15}$ atoms/cm$^3$.

In the SOI wafer manufactured in this way, the BOX layer 402 which is a silicon oxidized layer having a thickness of 200 nm has been formed on a surface of the second supporting substrate 405, the gettering layer 401a having a thickness of 1 μm and being mainly composed of a monocrystalline silicon with oxygen precipitation density of $1×10^9$ pieces cm$^3$ has been formed on a surface of the BOX layer 402, and the S layer 407 having a thickness of 5 μm and being mainly composed of a monocrystalline silicon has been formed on a surface of the gettering layer 401a.

Note that, in the present manufacturing method, oxygen is precipitated by subjecting the first wafer to two stages of heat treatments at 800° C. and at 1000° C., before the S layer 407 is formed by the vapor phase epitaxial method. The temperatures at the two stages of heat treatments may be a combination of a temperature for precipitation nucleus formation (low temperature) and a temperature for precipitation nucleus growth (high temperature). Alternatively, the first wafer may be subjected not to two stages of heat treatments, but to a single heat treatment at a high temperature of 1000° C. or more.

Also, when the heat treatment after the bonding step is appropriate enough to cause oxygen to be precipitated in the S layer 407, oxygen can be precipitated even if the heat treatments at 800° C. and at 1000° C. for the first wafer are omitted.

With the above SOI wafer manufacturing methods 1-4, it is possible to manufacture an SOI wafer having a high gettering ability, at a low cost and with good productivity.

[Manufacture of Semiconductor Apparatus]

The following describes an example of a manufacture of a semiconductor apparatus in which an SOI wafer, which is substantially the same as the SOI wafer 10 described above, is used as the starting material.

EXAMPLE 1 of Manufacture of Semiconductor Apparatus

In this example, a method for manufacturing a backlight imaging device having a photodiode as a buried device will be described.

Figure 6A:
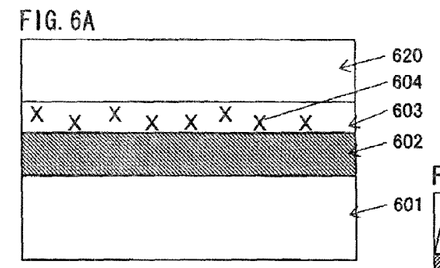
FIGS. 6A-6F illustrate a manufacturing method of the semiconductor apparatus in the embodiment.

As shown in FIG. 6A, the SOI wafer as the starting material, includes: a supporting substrate 601 which is a monocrystalline silicon substrate; a BOX layer 602 formed on a surface of the supporting substrate 601; a gettering layer 603 which is mainly composed of a silicon containing oxygen and is formed on a surface of the BOX layer 602; and an S layer 620 which is mainly composed of a P-type monocrystalline silicon and is formed on a surface of the gettering layer 603.

As the monocrystalline silicon substrate constituting the supporting substrate 601, a P-type, low-resistance substrate having 0.01-0.02 Ωcm of electrical resistivity is used, for which it is taken into account that a heat treatment involving a light irradiation by RTP (Rapid Thermal Processing) or the like needs to be performed in a stable manner.

In this example, the BOX layer 602 is 200 nm thick, and the gettering layer 603 is 1 μm thick. The S layer 620 is a P-type, monocrystalline epitaxial layer, having an electrical resistivity of 11-14 Ωcm and a thickness of 5 μm.

A gettering site 604 is formed in advance by subjecting the SOI wafer to a heat treatment at 1000° C. for four hours so that oxygen is precipitated in the gettering layer 603. The density of oxygen precipitated is, for example, $5×10^6$ pieces/cm$^2$.

By using this SOI wafer, an imaging device is formed as follows.

Figure 6B:
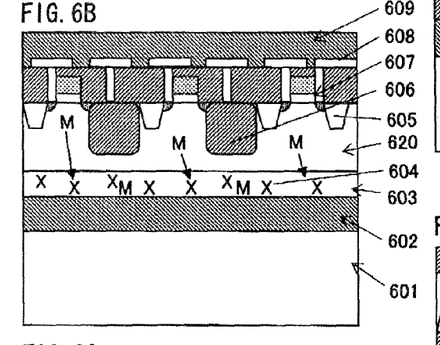

As shown in FIG. 6B, photodiodes 606, CMOS transistors 607 and device separators 605 are formed in a surface region of the S layer 620 in the SOI wafer, wherein the photodiodes 606 are formed as buried devices in a region having a depth of 3 μm from the surface.

Also, a wiring layer 608 is formed on a surface of the S layer 620, then an insulation layer 609 being a silicon dioxide film is formed on a surface of the wiring layer 608, and then the planarization process is performed by the chemical mechanical polishing method.

In this way, in the process of forming a semiconductor device in the S layer 620, the gettering layer 603 exerts the gettering function and captures metal impurities having entered the S layer 620. In FIG. 6B, the sign "M→X" indicates that the metal impurities M contained in the S layer 620 diffuse into the gettering layer 603 and are captured by the gettering site 604 represented by the sign "X" in the gettering layer 603.

With use of, as a donor wafer, the SOI wafer in which the semiconductor device has been formed in this way, the following steps are further performed.

Figure 6C:
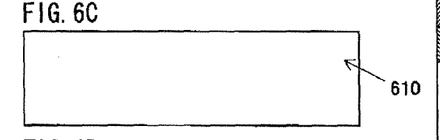

Bonding Step:

As a handle wafer, a second supporting substrate 610 shown in FIG. 6C, which is mainly composed of a P-type silicon wafer and has an electrical resistivity of 10-15 Ωcm, is prepared.

Figure 6D:
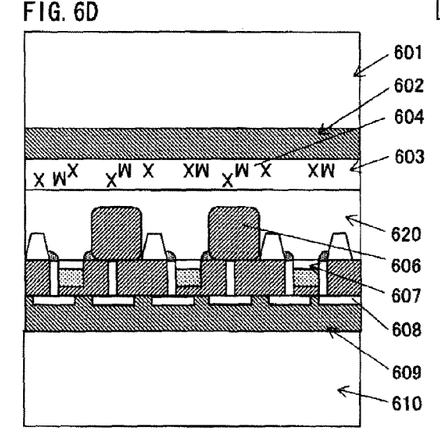

As shown in FIG. 6D, the second supporting substrate 610 and the SOI wafer (donor wafer) are bonded together by bonding a surface of the second supporting substrate 610 with a surface of an insulation layer 609 of the SOI wafer, and the bonded substrate and wafer are subjected to a heat treatment to stabilize the bonding. Since a wiring has already been formed in the SOI wafer, the heat treatment is performed at a relatively low temperature (for example, 400° C.).

Polishing Step:

The bonded substrate and wafer are polished starting with the front surface of the supporting substrate 601. The supporting substrate 601 is entirely polished away, and the polishing is stopped at the BOX layer 602.

In this polishing step, the BOX layer 602 functions as a stopper layer, increasing the controllability of the polishing. In view of this, it is preferable to set the layer thickness of the BOX layer 602 to a layer thickness that is appropriate as a polishing stopper layer.

Figure 6E:
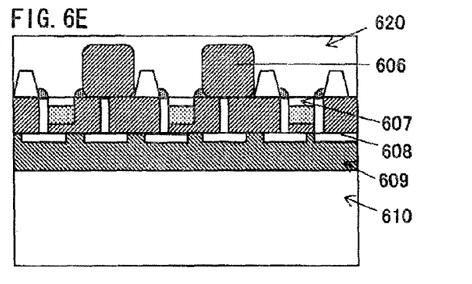

Next, the BOX layer 602 is removed by etching and the gettering layer 603 is entirely polished away, and as shown in FIG. 6E, 1 μm out of 5 μm in thickness of the S layer 620 is polished away for the S layer 620 to be 4 μm thick. In the S layer 620, the photodiodes 606 have been formed to be 3 μm deep from the surface. Accordingly, even if the S layer 620 is polished away by 1 μm, there still remains a 1 μm thick region of the S layer 620 on the photodiodes 606.

Subsequent to this, a protection layer 611 is formed on the surface of the S layer 620. After this, although not illustrated, processes are performed to form a filter, lens and the like on the protection layer 611.

Figure 6F:
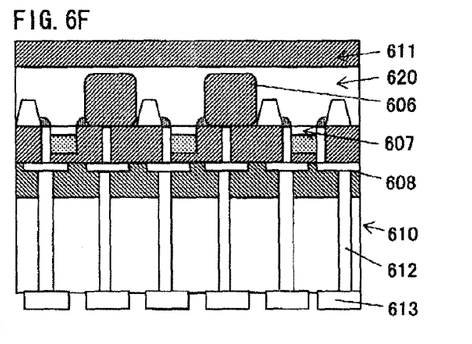

On the other hand, as shown in FIG. 6F, a TSVs (Through Silicon Vias) 612 are formed from the back surface of the second supporting substrate 610 toward the wiring layer 608, inside of each TSV is wired, and wire leads 613 are formed as pads or bumps on the back surface of the second supporting substrate 610.

This completes description of the manufacture of a backlight imaging device having a photodiode on the second supporting substrate 610.

According to the manufacturing method of the semiconductor apparatus described above, in the imaging device forming process, the gettering layer 603 with the gettering ability is present immediately under the S layer 620 which is an active layer, until the wiring step is completed, and thus a sufficient gettering ability is ensured. When a solid-state imaging device contains metal impurities, a defect is apt to be induced by them. This suggests that the effect obtained by gettering the metal impurities is large, as well.

Also, the gettering layer 603 having gettered the metal impurities is removed by etching or polishing, after the wafer is bonded. This prevents the metal impurities captured by the gettering layer 603 from being released and ill-affecting the semiconductor device.

Note that how and to what extent the gettering layer 603 should be removed by polishing or etching is determined at the stage of design of the semiconductor device. All or part of the gettering layer 603 may be retained in the semiconductor device.

EXAMPLE 2 of Manufacture of Semiconductor Apparatus

Next, Example 2 of manufacture of semiconductor apparatus, in which a semiconductor apparatus containing a high-resistance MOS transistor, will be described.

Figure 7:
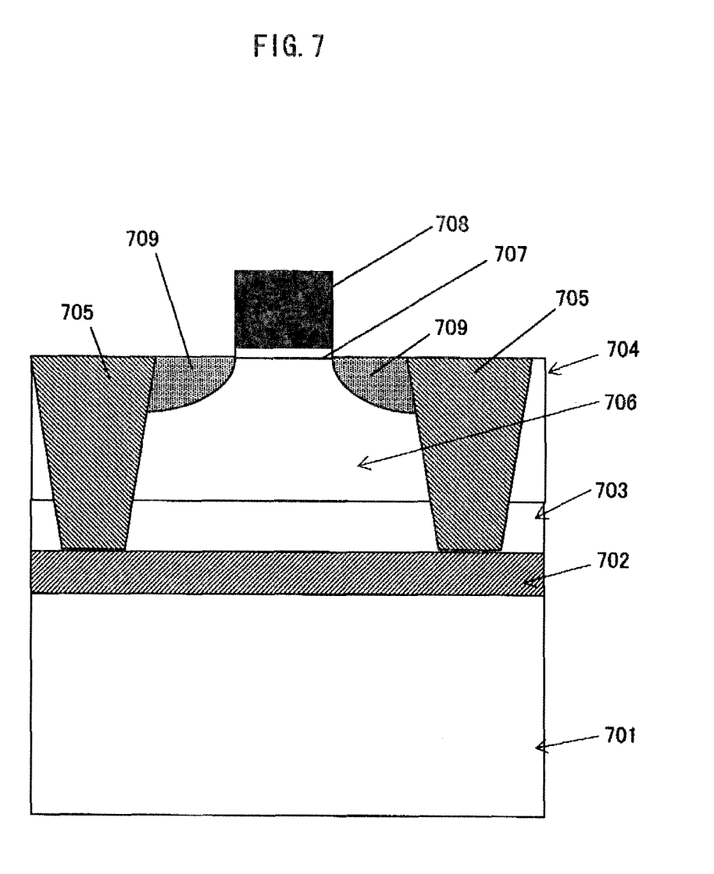
FIG. 7 illustrates a manufacturing method of the semiconductor apparatus in the embodiment.

FIG. 7 illustrates a semiconductor device manufactured by Example 2 of manufacture of semiconductor apparatus. In this Example 2, different from Example 1, the SOI substrate including the gettering layer remains in the semiconductor device as it is.

An SOI wafer is used as the starting material for forming a semiconductor apparatus, the SOI wafer including: a supporting substrate 701 being a monocrystalline silicon substrate; a BOX layer 702 which is a silicon oxidized layer formed on a surface of the supporting substrate 701; a gettering layer 703 formed on a surface of the BOX layer 702; and an S layer 704 which is mainly composed of a P-type monocrystalline silicon and is formed on a surface of the gettering layer 703.

In the supporting substrate 701, a P-type, low-resistance substrate having 0.01-0.02 Ωcm of electrical resistivity is used, for which it is taken into account that a heat treatment involving a light irradiation by RTP or the like needs to be performed in a stable manner. In this example, the BOX layer 702 is 1 μm thick, and the gettering layer 703 is 1 μm thick. The S layer 704 is a P-type, monocrystalline epitaxial layer, having an electrical resistivity of 11-14 Ωcm and a thickness of 2 μm.

Before the manufacturing process of the semiconductor apparatus, the SOI wafer is subjected to a heat treatment at 1000° C. for four hours so that oxygen is precipitated in the gettering layer 703. The density of oxygen precipitated is, for example, $1 \times 10^9$ pieces/cm$^3$.

In the above SOI wafer, device separators 705 are formed, the device separators 705 being oxidized layers extending from the surface of the S layer 704 to the BOX layer 702, passing through the S layer 704. Also, MOS transistors including source drains 709 are formed in S layer active areas 706 surrounded by the device separators 705. With this step, the semiconductor device shown in FIG. 7 is manufactured.

The manufactured semiconductor device is suited for a high-resistance device because the S layer active areas 706, in which the MOS transistors have been formed, are completely separated by the device separators 705.

Meanwhile, in a high-resistance device, since a high voltage is applied, not only the device separation needs to be complete, but a gate oxidized layer 707 of the MOS transistor needs to be highly reliable.

In conventional SOI wafers, the device separation is complete due to the use of oxidized layers. However, since they do not have a strong gettering property, the conventional SOT wafers have a problem regarding the reliability because there is a risk that an insulation breakdown may occur to the gate oxidized layer.

On the other hand, the semiconductor apparatus manufactured in the present example of manufacture has the 1 μm thick gettering layer 703 immediately below the MOS transistors with a thickness of 2 μm therebetween, and the gettering layer 703 keeps capturing metal impurities during and after the formation of the gate oxidized layer 707. This ensures the reliability of the gate oxidized layer 707.

Note that in the present example of manufacture, a manufacture of a high-resistance CMOS device is described. However, this can be applied to the manufacture of a normal CMOS device only by changing the thickness of the S layer or the BOX layer, and the same effects can be obtained.

Also, in the present example of manufacture, MOS transistors are formed in the S layer. However, of course, other semiconductor devices constituting a high resistance device can be formed in the same manner.

As described above through Examples 1 and 2 of manufacture of semiconductor apparatus, the SOI wafer 10 has an excellent gettering ability for capturing metal impurities contained in the S layer, and thus semiconductor devices manufactured by using this SOI wafer can powerfully getter the metal impurities. This improves the performance and reliability of the semiconductor device. Furthermore, there is no need to perform a complicated step to provide the gettering ability, in the semiconductor manufacturing process.

[Industrial Applicability]

The SOI wafer of the present invention is suited for the manufacture of a semiconductor device, such as a solid-state imaging device.

[Reference Signs List]
- 1 supporting substrate
- 2 BOX layer
- 3 gettering layer
- 4 S layer
- 10 SOI wafer
- 101 first supporting substrate
- 102 S layer (silicon epitaxial layer)
- 103 gettering layer
- 104 second supporting substrate
- 105 BOX layer
- 201 supporting substrate
- 202 S layer
- 202 silicon epitaxial layer
- 202a S layer
- 204 gettering layer
- 205 supporting substrate
- 206 BOX layer
- 301 first supporting substrate
- 302 S layer
- 303 amorphous silicon layer
- 305 gettering layer
- 306 second supporting substrate
- 307 BOX layer
- 401 monocrystalline silicon substrate
- 401a gettering layer
- 402 BOX layer
- 404 ion implanted area
- 405 second supporting substrate
- 407 S layer
- 601 supporting substrate
- 602 BOX layer
- 603 gettering layer
- 604 gettering site
- 620 S layer
- 701 supporting substrate
- 702 BOX layer
- 703 gettering layer
- 704 S layer

The invention claimed is:

1. An SOI wafer comprising:
a supporting substrate mainly composed of a monocrystalline silicon;
an insulation layer being a silicon oxide layer provided on a surface of the supporting substrate;
a gettering layer provided immediately on the insulation layer and mainly composed of a silicon which contains two or more of oxygen, carbon and nitrogen and contains at least oxygen and nitrogen; and
a monocrystalline silicon layer provided immediately on the gettering layer.

2. The SOI wafer of claim 1, wherein
the gettering layer contains germanium or an electrically conductive impurity.

3. The SOI wafer of claim 1, wherein
a state of the silicon constituting the gettering layer is one of monocrystalline, polycrystalline, noncrystalline, and a mixture of noncrystalline and polycrystalline.

4. The SOI wafer of claim 3, wherein
the state of the silicon constituting the gettering layer is one of noncrystalline and a mixture of noncrystalline and polycrystalline.

5. The SOI wafer of claim 1, wherein
a concentration of the oxygen contained in the gettering layer is $1 \times 10^{18}$ atoms/cm$^3$ or more.

6. The SOI wafer of claim 1, wherein
the gettering layer contains carbon, and a concentration of the carbon contained in the gettering layer is $3 \times 10^{16}$ atoms/cm$^3$ or more.

7. The SOI wafer of claim 1, wherein
a concentration of the nitrogen contained in the gettering layer is $1 \times 10^{14}$ atoms/cm$^3$ or more.

8. The SOI wafer of claim 1, wherein
a thickness of the monocrystalline silicon layer is in a range from 1 μm to 50 μm.

9. The SOI wafer of claim 1, wherein
a thickness of the gettering layer is smaller than a thickness of the monocrystalline silicon layer.

10. The SOI wafer of claim 1, wherein
the SOI wafer is used as a material for manufacturing a high-voltage device of 200 V or more, or as a material for manufacturing an image device having a buried photodiode, and
a thickness of the monocrystalline silicon layer is in a range from 1 μm to 10 μm.

11. The SOI wafer of claim 1, wherein
the SOI wafer is used as a material for manufacturing a high-voltage device of 500 V or more, and
a thickness of the monocrystalline silicon layer is in a range from 10 μm to 50 μm.

* * * * *